(12) United States Patent
Lazar

(10) Patent No.: US 10,904,663 B2
(45) Date of Patent: Jan. 26, 2021

(54) RELUCTANCE FORCE COMPENSATION FOR LOUDSPEAKER CONTROL

(71) Applicant: Samsung Electronics Co., Ltd., Suwon-si (KR)

(72) Inventor: James Lazar, Moorpark, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/659,402

(22) Filed: Oct. 21, 2019

(65) Prior Publication Data

US 2020/0344548 A1 Oct. 29, 2020

Related U.S. Application Data

(60) Provisional application No. 62/838,804, filed on Apr. 25, 2019.

(51) Int. Cl.
*H04R 3/04* (2006.01)
*G06F 17/17* (2006.01)
*H04R 1/22* (2006.01)
*G06F 30/20* (2020.01)

(52) U.S. Cl.
CPC .............. *H04R 3/04* (2013.01); *G06F 17/17* (2013.01); *G06F 30/20* (2020.01); *H04R 1/22* (2013.01)

(58) Field of Classification Search
None
See application file for complete search history.

(56) References Cited

U.S. PATENT DOCUMENTS

| | | |
|---|---|---|
| 8,682,002 B2 | 3/2014 | Wihardja et al. |
| 9,326,066 B2 | 4/2016 | Klippel |
| 9,398,374 B2 | 7/2016 | Lashkari et al. |
| 9,848,262 B2 | 9/2017 | Iyer et al. |

(Continued)

FOREIGN PATENT DOCUMENTS

JP 2011109487 A 10/2019

OTHER PUBLICATIONS

W. Klippel, Tutorial: loudspeaker nonlinearities—causes, parameters, symptoms, Journal of the Audio Engineering Society 54 (10) (2006) 907-939. (Year: 2006).*

(Continued)

*Primary Examiner* — Kenny H Truong
(74) *Attorney, Agent, or Firm* — Sherman IP LLP; Kenneth L. Sherman; Hemavathy Perumal

(57) ABSTRACT

One embodiment provides a method for nonlinear control of a loudspeaker. The method comprises determining a target displacement of a diaphragm of a speaker driver of the loudspeaker based on a physical model of the loudspeaker and a source signal for reproduction via the speaker driver. The method further comprises determining, based on the target displacement, a corrected drive signal that compensates for action of reluctance force on the speaker driver during the reproduction of the source signal, and transmitting the corrected drive signal to a power amplifier connected to the loudspeaker. The power amplifier drives the speaker driver based on the corrected drive signal. Audio distortion generated by the speaker driver during the reproduction of the source signal is reduced based on the power amplifier output, via the corrected drive signal.

20 Claims, 10 Drawing Sheets

(56) References Cited

U.S. PATENT DOCUMENTS

| | | | |
|---|---|---|---|
| 2005/0047606 A1* | 3/2005 | Lee | H04R 3/002 |
| | | | 381/59 |
| 2013/0259245 A1 | 10/2013 | Cheng et al. | |
| 2015/0304772 A1 | 10/2015 | Risberg et al. | |
| 2016/0050489 A1 | 2/2016 | Lashkari et al. | |
| 2016/0134982 A1 | 5/2016 | Iyer | |
| 2017/0061982 A1 | 3/2017 | Pakarinen et al. | |
| 2017/0188150 A1 | 6/2017 | Brunet et al. | |
| 2017/0280241 A1* | 9/2017 | Iyer | H04R 3/04 |
| 2018/0192192 A1 | 7/2018 | Brunet et al. | |

OTHER PUBLICATIONS

Middlebrook, R.D., "Methods of Design-Oriented Analysis: The Quadratic Equation Revisited," 1992 Frontiers in Education Conference, pp. 95-102, IEEE, United States.

International Search Report and Written Opinion dated Jul. 29, 2020 for International Application PCT/KR2020/005008 from Korean Intellectual Property Office, pp. 1-9, Republic of Korea.

* cited by examiner

RELUCTANCE FORCE COMPENSATION FOR LOUDSPEAKER CONTROL

CROSS-REFERENCE TO RELATED APPLICATIONS

This application claims the priority benefit of U.S. Provisional Patent Application Ser. No. 62/838,804, filed Apr. 25, 2019, all incorporated herein by reference in their entirety

TECHNICAL FIELD

One or more embodiments relate generally to loudspeakers, and in particular, reluctance force compensation for loudspeaker control.

BACKGROUND

A loudspeaker reproduces audio when connected to a receiver (e.g., a stereo receiver, a surround receiver, etc.), a television (TV) set, a radio, a music player, an electronic sound producing device (e.g., a smartphone), video players, etc.

SUMMARY

One embodiment provides a method for nonlinear control of a loudspeaker. The method comprises determining a target displacement of a diaphragm of a speaker driver of the loudspeaker based on a physical model of the loudspeaker and a source signal for reproduction via the speaker driver. The method further comprises determining, based on the target displacement, a corrected drive signal that compensates for action of reluctance force on the speaker driver during the reproduction of the source signal, and transmitting the corrected drive signal to a power amplifier connected to the loudspeaker. The power amplifier drives the speaker driver based on the corrected drive signal. Audio distortion generated by the speaker driver during the reproduction of the source signal is reduced based on the power amplifier output, via the corrected drive signal.

Another embodiment provides a system for nonlinear control of a loudspeaker. The system comprises a power amplifier connected to the loudspeaker, and a controller connected to the power amplifier. The controller is configured to determine a target displacement of a diaphragm of a speaker driver of the loudspeaker based on a physical model of the loudspeaker and a source signal for reproduction via the speaker driver. The controller is further configured to determine, based on the target displacement, a corrected drive signal that compensates for action of reluctance force on the speaker driver during the reproduction of the source signal, and transmit the corrected drive signal to the power amplifier. The power amplifier drives the speaker driver based on the corrected drive signal. Audio distortion generated by the speaker driver during the reproduction of the source signal is reduced based on the power amplifier output, via the corrected drive signal.

One embodiment provides a loudspeaker device comprising a speaker driver including a diaphragm, a power amplifier connected to the speaker driver, and a controller connected to the power amplifier. The controller is configured to determine a target displacement of the diaphragm based on a physical model of the loudspeaker device and a source signal for reproduction via the speaker driver. The controller is further configured to determine, based on the target displacement, a corrected drive signal that compensates for action of reluctance force on the speaker driver during the reproduction of the source signal, and transmit the corrected drive signal to the power amplifier. The power amplifier drives the speaker driver based on the corrected drive signal. Audio distortion generated by the speaker driver during the reproduction of the source signal is reduced based on the power amplifier output, via the corrected drive signal.

These and other features, aspects and advantages of the one or more embodiments will become understood with reference to the following description, appended claims, and accompanying figures.

DETAILED DESCRIPTION

Figure 1:
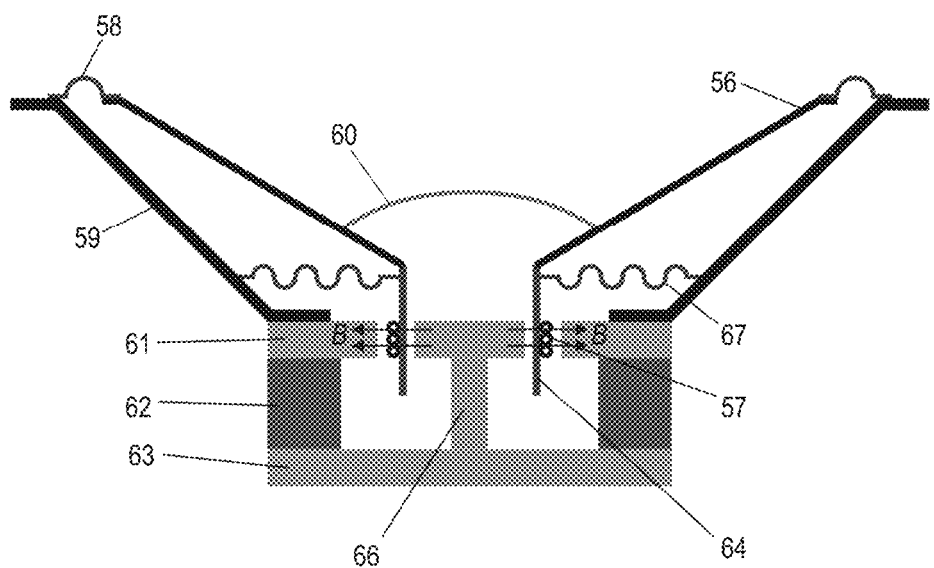
FIG. 1 illustrates a cross section of an example speaker driver.

The following description is made for the purpose of illustrating the general principles of one or more embodiments and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

One or more embodiments relate generally to loudspeakers, and in particular, reluctance force compensation for loudspeaker control. One embodiment provides a method for nonlinear control of a loudspeaker. The method comprises determining a target displacement of a diaphragm of a speaker driver of the loudspeaker based on a physical model of the loudspeaker and a source signal for reproduction via the speaker driver. The method further comprises determining, based on the target displacement, a corrected drive signal that compensates for action of reluctance force on the speaker driver during the reproduction of the source signal, and transmitting the corrected drive signal to a power amplifier connected to the loudspeaker. The power amplifier drives the speaker driver based on the corrected drive signal. Audio distortion generated by the speaker driver during the reproduction of the source signal is reduced based on the power amplifier output, via the corrected drive signal.

For expository purposes, the terms "loudspeaker", "loudspeaker device", "loudspeaker system", and "audio system" may be used interchangeably in this specification.

For expository purposes, the terms "displacement" and "excursion" may be used interchangeably in this specification.

A conventional loudspeaker is nonlinear by design and produces unintended harmonics, intermodulation components, and modulation noise. For example, reluctance force is a mechanical force caused by spatial variations in voice-coil inductance of a speaker driver of a loudspeaker. The reluctance force is inherently nonlinear and generates negative effects, such as audio distortion (i.e., audible distortion) in audio output produced by the loudspeaker. The audio distortion degrades sound quality of the audio output produced by the loudspeaker (e.g., audio quality and speech intelligibility). As such, an anti-distortion system for countering effects of reluctance force in a loudspeaker is needed to reduce or minimize audio distortion in audio output produced by the loudspeaker.

One conventional solution for limiting effects of reluctance force in a loudspeaker is to minimize voice-coil inductance and changes in the voice-coil inductance using a shorting-ring in the construction of a speaker driver of the loudspeaker. A disadvantage of using the shorting-ring, however, is increased material and manufacturing costs of incorporating the shorting-ring into the speaker driver.

Another conventional approach is to ignore effects of reluctance force in a loudspeaker, resulting in audio distortion in audio output produced by the loudspeaker device.

Some audio systems incorporate Digital Signal Processing (DSP) and nonlinear control to correct for audio distortion-inducing nonlinear effects encountered while driving the loudspeakers.

One or more embodiments provide a method and system for countering effects of reluctance force in a loudspeaker to reduce or minimize audio distortion in audio output produced by the loudspeaker.

A loudspeaker device includes at least one speaker driver for reproducing sound. FIG. 1 illustrates a cross section of an example speaker driver 55. The speaker driver 55 comprises one or more moving components, such as a diaphragm 56 (e.g., a cone-shaped diaphragm), a driver voice coil 57, a former 64, and a protective cap 60 (e.g., a dome-shaped dust cap). The speaker driver 55 further comprises one or more of the following components: (1) a surround roll 58 (e.g., suspension roll), (2) a basket 59, (3) a top plate 61, (4) a magnet 62, (5) a bottom plate 63, (6) a pole piece 66, and (7) a spider 67.

Figure 2:
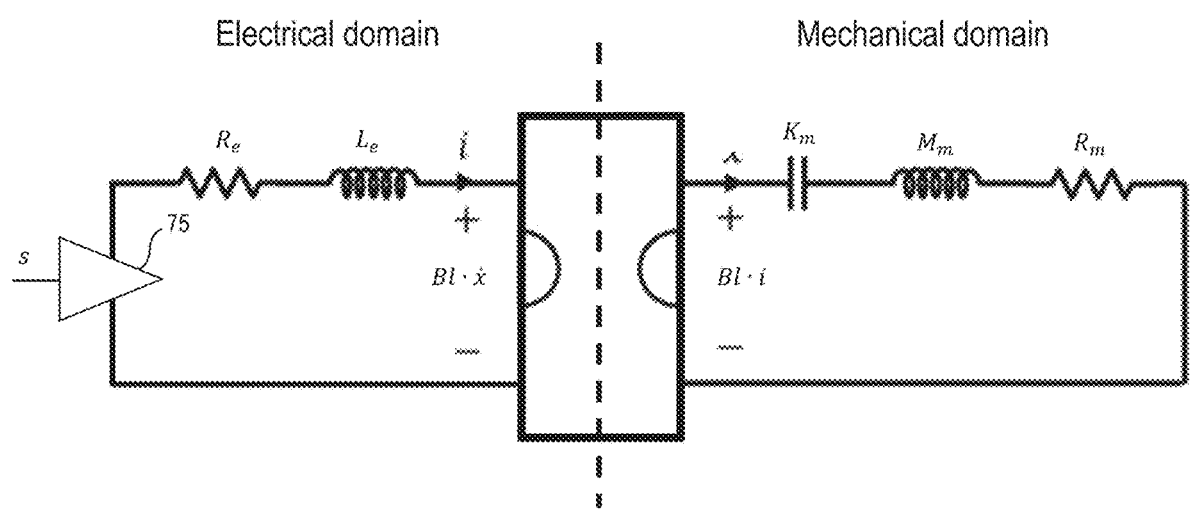
FIG. 2 illustrates an example electroacoustic model for a sealed-box loudspeaker device driven by a power amplifier.

FIG. 2 illustrates an example equivalent electromechanical model 70 for a sealed-box loudspeaker device driven by a power amplifier 75. The power amplifier 75 receives an input signal s, and delivers power to the loudspeaker device as prescribed by input signal s. In one embodiment, output from the power amplifier 75 may be a low-impedance type, wherein the power comprises an output voltage that is substantially proportional to the input signal s. In another embodiment, output from the power amplifier 75 may be a high-impedance type, wherein the power comprises an output current that is substantially proportional to the input signal s. In another embodiment, output from the power amplifier 75 may have some other known output impedance, with a known transfer characteristic between the power and the input signal s. The input signal s may be any type of audio signal such as, but not limited to, an analog signal, a digital signal, a Pulse-Width Modulated (PWM) signal, a differential signal, etc.

One or more loudspeaker parameters (i.e., loudspeaker characteristics) for the loudspeaker device may be classified into one or more of the following domains: an electrical domain or a mechanical domain. In the electrical domain, examples of different loudspeaker parameters include, but are not limited to, the following: (1) an electrical resistance $R_e$ of a driver voice coil 57 of a speaker driver 55 of the loudspeaker device, (2) a voice-coil inductance $L_e$ of the driver voice coil 57, wherein the voice-coil inductance $L_e$ is nonlinear and varies with a displacement x of one or more moving components (e.g., a diaphragm 56, the driver voice coil 57, and/or the former 64) of the speaker driver 55 from its rest position (e.g., cone displacement of a cone-shaped diaphragm), and (3) a back electromagnetic force (back-EMF) Bl·ẋ resulting from motion of the driver voice coil 57 in a magnetic field (i.e., magnetic flux density) B (FIG. 1) induced by a magnet 62 of the speaker driver 55, wherein the force factor Bl is nonlinear and varies with the displacement x of the one or more moving components, and the back-EMF Bl·ẋ is a product of the force factor Bl and a velocity ẋ of the one or more moving components of the speaker driver 55 (e.g., cone velocity of a cone-shaped diaphragm).

In the mechanical domain, examples of different loudspeaker parameters include, but are not limited to, the following: (1) the velocity ẋ of the one or more moving components of the speaker driver 55, (2) an equivalent mechanical mass $M_m$ of the one or more moving components (i.e., mechanical moving mass) plus air load, (3) an equivalent mechanical resistance $R_m$ of a suspension (e.g., surround roll 58 and spider 67) plus air load of the speaker driver 55, wherein the mechanical resistance $R_m$ represents the net mechanical losses of the speaker driver 55 plus air load, and the mechanical resistance $R_m$ is nonlinear and varies with the velocity ẋ of the one or more moving components of the speaker driver 55, and (4) an equivalent stiffness factor $K_m$ of the suspension of the speaker driver 55 plus the air in the sealed-box, wherein the equivalent stiffness factor $K_m$ is nonlinear and varies with the displacement x of the one or more moving components.

A Lorentz force $F_L$ is a primary force generated by a motor structure (i.e., driver voice coil 57, top plate 61, magnet 62, bottom plate 63, and pole piece 66) of a speaker driver 55 and acting on one or more moving components (e.g., a diaphragm 56, the driver voice coil 57, and/or the former 64) of the speaker driver 55. The Lorentz force $F_L$ results from a current i flowing through a wire of a driver voice coil 57 of the speaker driver 55, the voice coil immersed in a magnetic field B induced by the magnet 62 of the speaker driver 55. The Lorentz force $F_L$ is a desired force intended to drive a loudspeaker device comprising the speaker driver 55. A magnitude of the Lorentz force $F_L$ is represented by equation (1) provided below:

$$F_L = Bl(x) \cdot i \quad (1)$$

wherein B is the magnetic flux density, l is an effective length of the wire of the driver voice coil 57. In the absence of any reluctance force $F_R$, the Lorentz force $F_L$ is linear and proportional to a current i driving the speaker driver 55. Therefore, the Lorentz force $F_L$ is controlled by varying the current i.

Unlike the Lorentz force $F_L$ that is a desired force intended to drive a loudspeaker device comprising a speaker driver 55, a reluctance force $F_R$ is an undesired consequence of a variable voice-coil inductance $L_e$. Specifically, the reluctance force $F_R$ is a negative/unwanted effect resulting from the varying position of a driver voice coil 57 of the speaker driver 55 relative to the motor structure (i.e., top plate 61, magnet 62, bottom plate 63, and pole piece 66) of the speaker driver 55. The varying position of a driver voice coil 57 of the speaker driver 55 relative to the motor structure (i.e., top plate 61, magnet 62, bottom plate 63, and pole piece 66) of the speaker driver 55 causes variations in the voice-coil inductance, leading to reluctance force.

The reluctance force $F_R$ can be calculated from conservation of energy. The energy U stored in the magnetic field of voice-coil inductance $L_e$ is represented by equation (2) provided below:

$$U = \frac{1}{2} L_e i^2 \quad (2)$$

The reluctance force $F_R$ is related to a spatial variation (i.e., spatial rate of change) of the voice-coil inductance $L_e$. A magnitude of the reluctance force $F_R$ is represented by equation (3) provided below:

$$F_R = \frac{dU(x)}{dx} = \frac{1}{2} \frac{dL_e(x)}{dx} \cdot i^2 \quad (3)$$

The reluctance force $F_R$ is proportional to a square of a current i flowing through the wire of the driver voice coil 57. The reluctance force $F_R$ is nonlinear and results in audio distortion in audio output produced by the speaker driver 55.

Nonlinear dynamics for a loudspeaker device in which only the Lorentz force $F_L$ is considered (i.e., the reluctance force $F_R$ is not factored into account) can be represented with a single linear equation in i (4) provided below:

$$Bl(x) \cdot i = M_m \cdot \ddot{x} + R_m(\dot{x}) \cdot \dot{x} + K_m(x) \cdot x \quad (4)$$

wherein $\ddot{x}$ is an acceleration, $\dot{x}$ is a velocity, and x is a diplacement of the one or more moving components of the speaker driver 55.

Nonlinear dynamics for a loudspeaker device in which both the Lorentz force $F_L$ and the reluctance force $F_R$ are considered can be represented in accordance with a single quadratic equation (5) provided below:

$$F_R + F_L = \frac{1}{2} \frac{dL_e(x)}{dx} \cdot i^2 + Bl(x) \cdot i = M_m \cdot \ddot{x} + R_m(\dot{x}) \cdot \dot{x} + K_m(x) \cdot x \quad (5)$$

The single quadratic equation (5) representing nonlinear dynamics for a loudspeaker device in which both Lorentz force $F_L$ and reluctance force $F_R$ are considered is rearranged into standard form as a single quadratic equation (6) provided below:

$$\frac{1}{2} \frac{dL_e(x)}{dx} \cdot i^2 + Bl(x) \cdot i - [M_m \ddot{x} + R_m(\dot{x}) \cdot \dot{x} + K_m(x) \cdot x] = 0 \quad (6)$$

The single quadratic equation (6) is in standard form represented by equation (7) provided below:

$$ai^2 + bi + c = 0 \quad (7)$$

wherein coefficients a, b, and c are represented in accordance with equations (8)-(10) provided below:

$$a = \frac{1}{2} \frac{dL_e(x)}{dx} \quad (8)$$

$$b = Bl(x) \quad (9)$$

$$c = -[M_m \ddot{x} + R_m(\dot{x}) \cdot \dot{x} + K_m(x) \cdot x] \quad (10)$$

Based on equation (3), the reluctance force is proportional to $dL_e(x)/dx$. If $dL_e(x)/dx$ is zero, then the reluctance force $F_R$ is zero, and thus coefficient a is zero. Without any reluctance force $F_R$ (i.e., $F_R = 0$), the single quadratic equation (6) is reduced to a single linear equation (11) provided below:

$$Bl(x) \cdot i - [M_m \ddot{x} + R_m(\dot{x}) \cdot \dot{x} + K_m(x) \cdot x] = 0 \quad (11)$$

If there is no reluctance force $F_R$ (i.e., $F_R = 0$), a target current i is determined by solving the single linear equation (11). In one embodiment, if there is no reluctance force $F_R$ (i.e., $F_R = 0$), the reluctance force compensation unit 220 (FIG. 4) is configured to determine a target current i for a sampling time t based on a solution to the single linear equation (11) represented by equation (12) provided below:

$$i = \frac{[M_{ms} \cdot \ddot{x} + R_{ms}(\dot{x}) \cdot \dot{x} + K_{ms}(x) \cdot x]}{Bl(x)} \quad (12)$$

If there is any reluctance force $F_R$ (i.e., $F_R \neq 0$), a target current i is determined by solving the single quadratic equation (6). One solution to the single quadratic equation (6) involves computing quadratic roots $i_1$ and $i_2$ in equation (13) provided below:

$$ai^2 + bi + c = a(i - i_1)(i - i_2) \quad (13)$$

wherein only one of the quadratic roots $i_1$ and $i_2$ is the desired correct solution to the single quadratic equation (6). For example, the quadratic roots $i_1$ and $i_2$ can be computed using a particular quadratic formula. Based on this quadratic formula, the quadratic roots $i_1$ and $i_2$ can be computed by defining two factors F and $Q^2$ represented by equations (14)-(15) provided below:

$$F = \frac{1}{2} + \frac{1}{2}\sqrt{1 - 4Q^2} \quad (14)$$

$$Q^2 = \frac{ac}{b^2} \quad (15)$$

For the present application, coefficients a and c can be positive or negative, and the coefficient b (i.e., coefficient $b = Bl(x)$, the force factor) is positive. The factor $Q^2$ can therefore be positive or negative. The quadratic roots $i_1$ and $i_2$ can be written in terms of the coefficients a, b, and c and the factors F and $Q^2$ as represented by equations (16)-(17) provided below:

$$i_1 = -\frac{c}{b} \cdot \frac{1}{F} = \frac{[M_{ms}\ddot{x} + R_{ms}(x) \cdot \dot{x} + K_{ms}(x) \cdot x]}{Bl(x)} \cdot \frac{1}{F} \quad (16)$$

$$i_2 = -\frac{b}{a} \cdot F = -\frac{Bl(x)}{\frac{1}{2}\frac{dL_e(x)}{dx}} \cdot F \quad (17)$$

wherein the factor $Q^2$ is restricted to the range $$Q^2 \leq \frac{1}{4}$$

in order to limit the factor F and quadratic roots $i_1$ and $i_2$ to real values. If $Q^2$ is negative, the quadratic roots $i_1$ and $i_2$ assume real values and the factor F exceeds unity. If $Q^2$ is positive and in the range $$0 \leq Q^2 \leq \frac{1}{4},$$

the quadratic roots $i_1$ and $i_2$ are real values, and the factor F assumes values in the range $$1 \geq F \geq \frac{1}{2}.$$

To determine which of the quadratic roots $i_1$ and $i_2$ is the desired correct solution to the single quadratic equation (6), consider the case where the reluctance force $F_R$ tends to zero. When the reluctance force tends to zero, coefficient a tends to zero, and the factor F tends to unity. Under these conditions, the quadratic root $i_1$ defined by equation (16) is identical to equation (12) (i.e., the quadratic root $i_1$ is equal to a target current i when there is no reluctance force $F_R$), whereas the quadratic root $i_2$ defined by equation (17) grows without bound (i.e., $i_2 \rightarrow \infty$). Therefore, the quadratic root $i_1$ is the desired correct solution to the single quadratic equation (6), since the solution must be valid even as the reluctance force becomes vanishingly small.

Figure 3:
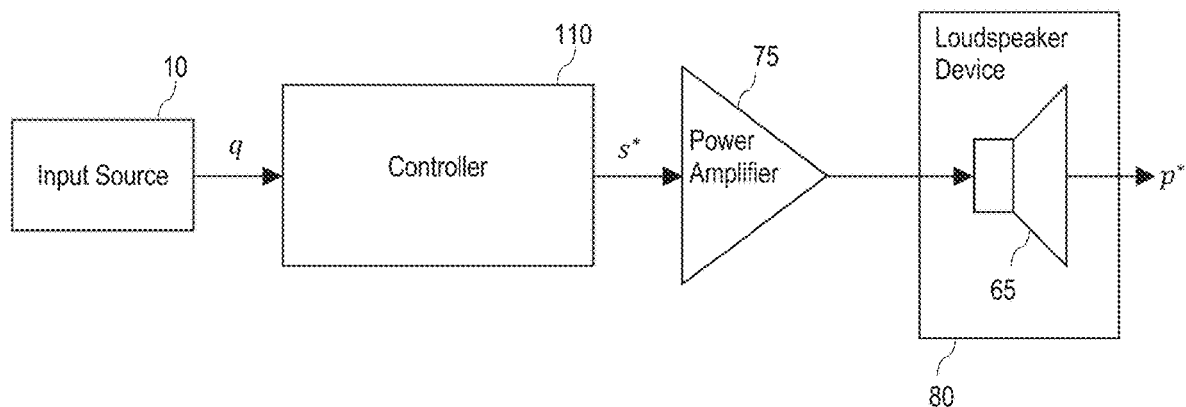
FIG. 3 illustrates an example loudspeaker control system, in accordance with an embodiment.

In one embodiment, if there is any reluctance force $F_R$ (i.e., $F_R \neq 0$), the reluctance force compensation unit 220 is configured to determine a target current i for a sampling time t based on a solution to the single quadratic equation (6) (i.e., the quadratic root $i_1$) represented by equation (18) provided below:

$$i = \frac{[M_m\ddot{x} + R_m(x) \cdot \dot{x} + K_m(x) \cdot x]}{Bl(x)} \cdot \frac{1}{F} \quad (18)$$

wherein the target current i is the product of a target current i when there is no reluctance force $F_R$ (determined in accordance with equation (12)), and a factor 1/F. Therefore, the factor 1/F is a correction factor for compensating/correcting effects of any reluctance force $F_R$ on the loudspeaker device 80 (FIG. 3).

In one embodiment, the reluctance force compensation unit 220 is configured to determine the correction factor 1/F based on an exact solution for the factor F that is represented by equation (14). Specifically, the reluctance force compensation unit 220 is configured to determine an exact value of the factor F in accordance with equation (14). As equation (14) requires a square-root calculation, determining an exact value of the factor F may incur additional computation time.

In one embodiment, to ensure that a target current i and the factor F are limited to real values and the target current i is limited to at most twice a target current i when there is no reluctance force $F_R$ (determined in accordance with equation (12)), the reluctance force compensation unit 220 is configured to enforce the following boundary condition: if $$Q^2 < \frac{1}{4},$$

the reluctance force compensation unit 220 is configured to determine an exact value of the factor F in accordance with equation (14); otherwise, if $$Q^2 \geq \frac{1}{4},$$

the reluctance force compensation unit 220 is configured to set an exact value of the factor F to $$\frac{1}{2}\left(\text{i.e., } F = \frac{1}{2}\right).$$

In another embodiment, to reduce/save computation time at the expense of accuracy, the reluctance force compensation unit 220 is configured to determine the correction factor 1/F based on an approximate solution for the factor F. Specifically, the reluctance force compensation unit 220 determines an approximate value of the factor F. For example, the exact solution for the factor F (determined in accordance with equation (14)) can be expressed as a Taylor Series Expansion as shown by equations (19)-(20) provided below:

$$\sqrt{1-x} = 1 - \frac{1}{2}x - \frac{1}{8}x^2 - \frac{1}{16}x^3 - \frac{5}{128}x^4 - \frac{7}{256}x^5 - \quad (19)$$

Setting $x=4Q^2$, the correction factor F can be expressed $$F = \frac{1}{2} + \frac{1}{2}\sqrt{1-4Q^2} = 1 - Q^2 - Q^4 - 2Q^6 - 5Q^8 - 14Q^{10} - \quad (20)$$

wherein equation (20) is a Taylor Series Expansion of the factor F with an infinite number of terms. Note that the Taylor Series Expansion is one of many possible approximate functions that can serve to estimate the factor F, and these alternate functions shall be considered within the scope of the present invention.

In one embodiment, the reluctance force compensation unit 220 is configured to determine an approximate value of the factor F in accordance with equation (20) using as many or as few terms as desired (i.e., different order Taylor Series Approximations of the factor F provide varying degrees of audio distortion reduction). For example, the reluctance force compensation unit 220 is configured to determine an approximate value of the factor F based on a zeroth-order approximation $F_0$ (an approximation of the factor F without any higher order terms, i.e., degree 0) represented by equation (21) provided below:

$$F_0 = 1 \quad (21)$$

wherein equation (21) provides no correction/compensation for reluctance force $F_R$.

As another example, the reluctance force compensation unit 220 is configured to determine an approximate value of the factor F based on a first-order approximation $F_1$ (an approximation of the factor F based on a Taylor Series Approximation of degree 1) represented by equation (22) provided below:

$$F_1 = 1 - Q^2 \quad (22)$$

As another example, the reluctance force compensation unit 220 is configured to determine an approximate value of the factor F based on a second-order approximation $F_2$ (an approximation of the factor F based on a Taylor Series Approximation of degree 2) represented by equation (23) provided below:

$$F_2 = 1 - Q^2 - Q^4 \quad (23)$$

As another example, the reluctance force compensation unit 220 is configured to determine an approximate value of the factor F based on a third-order approximation $F_3$ (an approximation of the factor F based on a Taylor Series Approximation of degree 3) represented by equation (24) provided below:

$$F_3 = 1 - Q^2 - Q^4 - 2Q^6 \quad (24)$$

As another example, the reluctance force compensation unit 220 is configured to determine an approximate value of the factor F based on a fourth-order approximation $F_4$ (an approximation of the factor F based on a Taylor Series Approximation of degree 4) represented by equation (25) provided below:

$$F_4 = 1 - Q^2 - Q^4 - 2Q^6 - 5Q^8 \quad (25)$$

As another example, the reluctance force compensation unit 220 is configured to determine an approximate value of the factor F based on a fifth-order approximation $F_5$ (an approximation of the factor F based on a Taylor Series Approximation of degree 5) represented by equation (26) provided below:

$$F_5 = 1 - Q^2 - Q^4 - 2Q^6 - 5Q^8 - 14Q^{10} \quad (26)$$

Each of the first-order approximation $F_1$, the second-order approximation $F_2$, the third-order approximation $F_3$, the fourth-order approximation $F_4$, and the fifth-order approximation $F_5$ provides some correction/compensation for reluctance force $F_R$, thereby resulting in some reduction in audio distortion in audio output produced by the loudspeaker device 80. Higher order approximations of the factor F offer a tradeoff between reduction in audio distortion and computation time. The controller 200 is configured to weigh these against the exact solution for the factor F in actual applications, considering audio distortion improvement and available microprocessor power. For example, in some applications, a first-order approximation is adequate and used for ease of computation. As another example, if greater accuracy is desired in some applications, a higher order approximation of the factor F or the exact solution for the factor F is used. As the approximate solution for the factor F does not incur any additional computation time involved with a square root calculation, utilizing the approximate solution may provide adequate performance in low-cost audio systems with inexpensive microprocessors.

FIG. 3 illustrates an example loudspeaker control system 100, in accordance with an embodiment. The loudspeaker control system 100 is an example nonlinear control system for a loudspeaker device 80 driven by a power amplifier 75. Specifically, the loudspeaker control system 100 comprises the loudspeaker device 80 including a speaker driver 65 for reproducing sound. In one embodiment, the loudspeaker device 80 is a sealed-box loudspeaker. In another embodiment, the loudspeaker device 80 is another type of loudspeaker such as, but not limited to, a vented box loudspeaker, a passive radiator loudspeaker, a loudspeaker array, a transmission line loudspeaker, a headphone, an earbud, etc.

The speaker driver 65 is any type of electro-dynamic speaker driver such as, but not limited to, a moving coil speaker driver, a moving magnet speaker driver, a compression speaker driver, a forward-facing speaker driver, an upward-facing speaker driver, a downward-facing speaker driver, etc. The speaker driver 55 in FIG. 1 is an example implementation of the speaker driver 65. The speaker driver 65 comprises one or more moving components, such as a diaphragm 56 (FIG. 1), a driver voice coil 57 (FIG. 1), a former 64 (FIG. 1), and a protective cap 60 (FIG. 1).

In one embodiment, the loudspeaker control system 100 comprises a controller 110 configured to receive a source signal q (e.g., an input audio signal) from an input source 10, and controls reproduction of the source signal via the loudspeaker device 80 to produce a desired audio output. In one embodiment, the desired audio output comprises, at any sampling time (i.e., instant) t, a target (i.e., desired) sound pressure p* of a target sound wave for the loudspeaker device 80 to produce at the sampling time t during the reproduction of the source signal. In one embodiment, the loudspeaker control system 100 is configured to determine the target sound pressure p* from the source signal q.

In one embodiment, the controller 110 is configured to receive a source signal q from different types of input sources 10. Examples of different types of input sources 10 include, but are not limited to, a mobile electronic device (e.g., a smartphone, a laptop, a tablet, etc.), a content playback device (e.g., a television, a radio, a computer, a music player such as a CD player, a video player such as a DVD player, a turntable, etc.), or an audio receiver, etc.

The loudspeaker control system 100 is configured to counter effects of any reluctance force $F_R$ on the loudspeaker device 80 during the reproduction of the source signal to reduce or minimize audio distortion in audio output produced by the loudspeaker device 80. In one embodiment, the controller 110 is configured to determine, at any sampling time t, based on a physical model of the loudspeaker device 80 and the desired audio output, one or more of the following: (1) a target displacement (e.g., target cone displacement) x* of the one or more moving components of the speaker driver 65 at the sampling time t, (2) a correction factor for countering negative effects (i.e., undesirable action) of any reluctance force $F_R$, (3) a target current i* that produces the target displacement x* at the sampling time t and compensates/corrects for the reluctance force $F_R$, thereby reducing or minimizing audio distortion in actual audio output produced by the loudspeaker device 80, and (4) a target voltage v* that produces the target displacement x* at the sampling time t and compensates/corrects for the reluctance force $F_R$, thereby reducing or minimizing audio distortion in actual audio output produced by the loudspeaker device 80.

In one embodiment, the controller 110 is configured to generate and transmit, at any sampling time t, a corrected drive signal s* specifying a target current i* for the sampling time t to the power amplifier 75 to drive the loudspeaker device 80. The corrected drive signal s* can be any type of signal such as, but not limited to, a current, a voltage, a digital signal, an analog signal, a differential signal, etc.

In one embodiment, the controller 110 is configured to generate and transmit, at any sampling time t, a corrected drive signal s* specifying a target voltage v* for the sampling time t to the power amplifier 75 to drive the loudspeaker device 80. The corrected drive signal s* can be any type of signal such as, but not limited to, a current, a voltage, a digital signal, an analog signal, a differential signal, etc.

A physical model of the loudspeaker device 80 is based on one or more loudspeaker parameters for the loudspeaker device 80. In one embodiment, a physical model of the loudspeaker device 80 utilized by the controller 110 is a nonlinear model.

As shown in FIG. 3, the power amplifier 75 is connected to the loudspeaker device 80 and the controller 110. In one embodiment, the power amplifier 75 is a current amplifier configured to output (i.e., apply or produce), at any sampling time t, an actual current i (i.e., applied current) based on a corrected drive signal s* received from the controller 110, wherein the corrected drive signal s* specifies a target current i* for the sampling time t. The corrected drive signal s* controls the power amplifier 75, directing the power amplifier 75 to output an amount of current that is substantially equal to the target current i*. The speaker driver 65 is driven by the actual current i, thereby controlling an actual displacement of the one or more moving components of the speaker driver 65 during the reproduction of the source signal. Specifically, the loudspeaker control system 100 controls cone displacement/motion of the one or more moving components based on the target current i*, resulting in production of a target sound wave with a target sound pressure p* at the sampling time t. The target current i* compensates/corrects for effects of any reluctance force $F_R$, thereby reducing or minimizing audio distortion in actual audio output produced by the loudspeaker device 80.

In one embodiment, the power amplifier 75 is a voltage amplifier configured to output (i.e., apply or produce), at any sampling time t, an actual voltage v (i.e., applied voltage) based on a corrected drive signal s* received from the controller 110, wherein the corrected drive signal s* specifies a target voltage v* for the sampling time t. The corrected drive signal s* controls the power amplifier 75, directing the power amplifier 75 to output an amount of voltage that is substantially the same as the target voltage v*. The speaker driver 65 is driven by the actual voltage v, thereby controlling an actual displacement of the one or more moving components of the speaker driver 65 during the reproduction of the source signal. Specifically, the loudspeaker control system 100 controls cone displacement/motion of the one or more moving components based on the target voltage v*, resulting in production of a target sound wave with a target sound pressure p* at the sampling time t. The target voltage v* compensates/corrects for effects of any reluctance force $F_R$, thereby reducing or minimizing audio distortion in actual audio output produced by the loudspeaker device 80.

The loudspeaker control system 100 facilitates a higher level of audio reproduction, with improved sound quality, and additional control of the loudspeaker device 80.

In one embodiment, the loudspeaker control system 100 may be integrated in different types of electrodynamic transducers with a broad range of applications such as, but not limited to, the following: computers, televisions (TVs), smart devices (e.g., smart TVs, smart phones, etc.), soundbars, subwoofers, wireless and portable speakers, mobile phones, headphones, earbuds, car speakers, etc.

The loudspeaker control system 100 can be employed to reduce material and manufacturing costs associated with speaker drivers in audio systems, obviating the need for shorting-rings or other means to stabilize voice-coil inductance.

Figure 4:
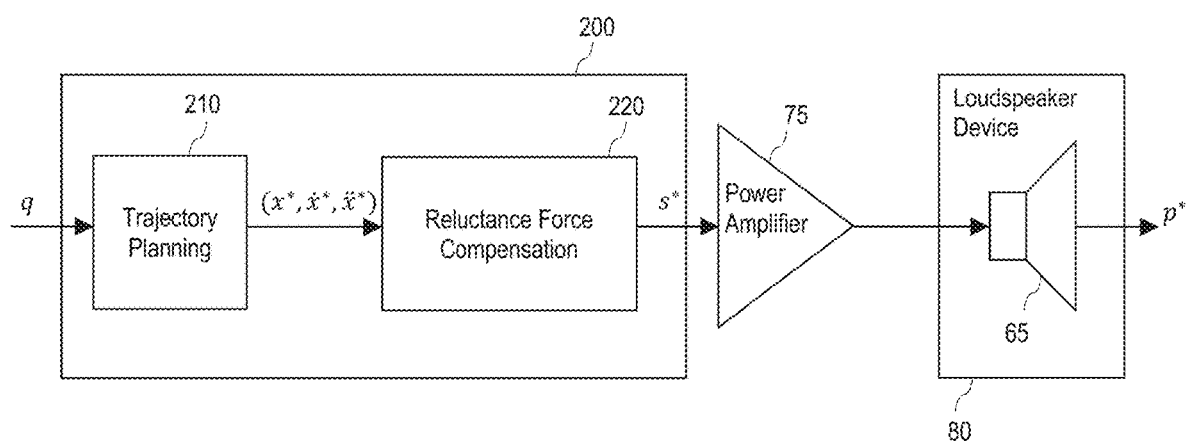
FIG. 4 illustrates an example controller for a loudspeaker device, in accordance with an embodiment.

FIG. 4 illustrates an example controller 200 for the loudspeaker device 80, in accordance with an embodiment. In one embodiment, the controller 110 of the loudspeaker control system 100 is the controller 200. In one embodiment, the controller 200 comprises a trajectory planning unit 210 configured to determine, at any sampling time t, a target displacement (i.e., target cone displacement) x* of one or more moving components (e.g., diaphragm 56 and/or driver voice coil 57) of the speaker driver 65 at the sampling time t based on a physical model of the loudspeaker device 80 and a target sound pressure p* of a target sound wave for the loudspeaker device 80 to produce at the sampling time t during reproduction of a source signal (e.g., input audio signal). In one embodiment, the trajectory planning unit 210 is further configured to determine, at any sampling time t, a target velocity $\dot{x}^*$ and a target acceleration $\ddot{x}^*$ of the one or more moving components at the sampling time t based on the physical model of the loudspeaker device 80. In one embodiment, the physical model of the loudspeaker device 80 utilized by the trajectory planning unit 210 is a nonlinear model.

In one embodiment, the controller 200 comprises a reluctance force compensation unit 220 configured to, at any sampling time t, perform the following: (1) receive a target displacement x* of the one or more moving components of the speaker driver 65 at the sampling time t, (2) determine a correction factor for countering effects of any reluctance force $F_R$, and (3) determine a target current i* that produces the target displacement x* at the sampling time t and compensates/corrects for the reluctance force $F_R$ based on the correction factor. In one embodiment, the reluctance force compensation unit 220 is further configured to receive, at any sampling time t, a target velocity $\dot{x}^*$ and a target acceleration $\ddot{x}^*$ of the one or more moving components at the sampling time t.

In one embodiment, the controller 200 comprises a reluctance force compensation unit 220 configured to, at any sampling time t, perform the following: (1) receive a target displacement x* of the one or more moving components of the speaker driver 65 at the sampling time t, (2) determine a correction factor for countering effects of any reluctance force $F_R$, (3) determine a target current i* that produces the target displacement x* at the sampling time t and compensates/corrects for the reluctance force $F_R$ based on the correction factor, and (4) determine a target voltage v* that produces the target current i* at the sampling time t. In one embodiment, the reluctance force compensation unit 220 is further configured to receive, at any sampling time t, a target velocity $\dot{x}^*$ and a target acceleration $\ddot{x}^*$ of the one or more moving components at the sampling time t.

In one embodiment, the reluctance force compensation unit 220 is configured to generate and transmit a corrected drive signal s* specifying a target current i* for a sampling time t to the power amplifier 75 for driving the loudspeaker device 80. The corrected drive signal s* may be any type of signal, including but not limited to an analog signal, a digital signal, a PWM signal, a differential signal, etc.

In one embodiment, the reluctance force compensation unit 220 is configured to generate and transmit a corrected drive signal s* specifying a target voltage v* for a sampling time t to the power amplifier 75 for driving the loudspeaker device 80. The corrected drive signal s* may be any type of signal, including but not limited to an analog signal, a digital signal, a PWM signal, a differential signal, etc.

In one embodiment, the controller 200 is configured to implement feedback control. For example, in one embodiment, if the power amplifier 75 is a current amplifier, the controller 200 is configured to: (1) monitor a current measured at the terminals of the speaker driver 65 at each sampling time t, (2) recalculate, based on the measured current and a corrected drive signal s* specifying a target current i* for the sampling time t, one or more loudspeaker parameters for the loudspeaker device 80, and (3) provide one or more updates of the one or more loudspeaker parameters (e.g., an update of stiffness factor $K_{ms}$) to the reluctance force compensation unit 220. The one or more updates of the one or more loudspeaker parameters may be used to compensate for or minimize one or more inaccuracies (e.g., manufacturing dispersion, environmental conditions, component aging effects) associated with a physical model utilized by the controller 200 and/or audio drifting (e.g., resulting from heating of the loudspeaker device 80), providing improved control of the loudspeaker device 80 with reduced audio distortion. For example, the loudspeaker parameters may be adjusted to compensate for variations originating from intrinsic and extrinsic variations, such as manufacturing tolerances, present operating conditions (e.g., temperature of driver voice coil 57), environmental effects such as pressure and temperature, and aging of components and materials of the loudspeaker control system 100. Therefore, the loudspeaker control system 100 may account for changes in components and materials that vary over time and environmental conditions, and counter detrimental effects of temperature (e.g., resistance variation of driver voice coil 57), pressure, and aging.

As another example, in one embodiment, if the power amplifier 75 is a voltage amplifier, the controller 200 is configured to: (1) monitor a voltage measured at the terminals of the speaker driver 65 at each sampling time t, (2) recalculate, based on the measured voltage and a corrected drive signal s* specifying a target voltage v* for the sampling time t, one or more loudspeaker parameters for the loudspeaker device 80, and (3) provide one or more updates of the one or more loudspeaker parameters (e.g., an update of stiffness factor $K_{ms}$) to the reluctance force compensation unit 220. The one or more updates of the one or more loudspeaker parameters may be used to compensate for or minimize one or more inaccuracies (e.g., manufacturing dispersion, environmental conditions, component aging effects) associated with a physical model utilized by the controller 200 and/or audio drifting (e.g., resulting from heating of the loudspeaker device 80), providing improved control of the loudspeaker device 80 with reduced audio distortion. For example, the loudspeaker parameters may be adjusted to compensate for variations originating from intrinsic and extrinsic variations, such as manufacturing tolerances, present operating conditions (e.g., temperature of driver voice coil 57), environmental effects such as pressure and temperature, and aging of components and materials of the loudspeaker control system 100. Therefore, the loudspeaker control system 100 may account for changes in components and materials that vary over time and environmental conditions, and counter detrimental effects of temperature (e.g., resistance variation of driver voice coil 57), pressure, and aging.

In one embodiment, the feedback control implemented by the controller 200 may be based on various control methods such as, but not limited to, state feedback control, adaptive control (e.g., using an online system identification), Proportional-Integral-Derivative (PID) control, etc.

In another embodiment, if the speaker driver 65 has well known and stable characteristics, the controller 200 need not factor into account any corrections, thereby removing the need for feedback control.

Figure 5:
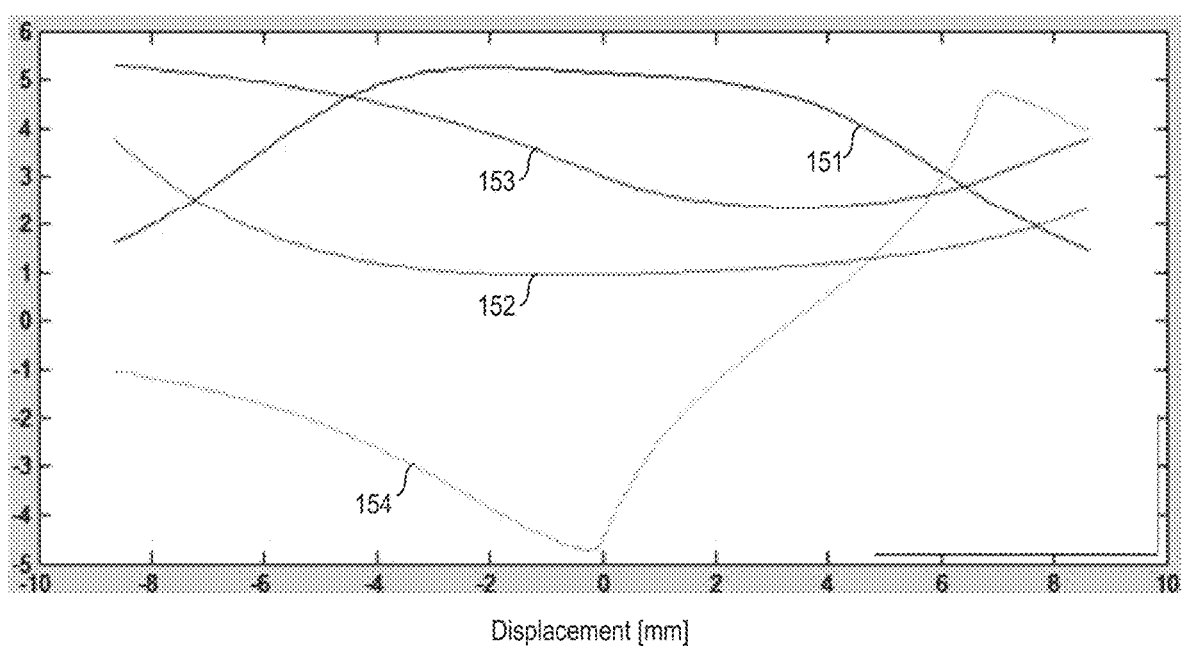
FIG. 5 is an example graph illustrating nonlinear dynamics of different electromechanical parameters for a speaker driver.

FIG. 5 is an example graph 150 illustrating nonlinear dynamics of different electromechanical parameters for a speaker driver 55. A horizontal axis of the graph 150 represents displacement of one or more moving components (e.g., diaphragm 56 and/or driver voice coil 57) of the speaker driver 55 in millimeter (mm). The graph 150 comprises each of the following: (1) a first curve 151 representing a force factor 131 of a motor structure (i.e., driver voice coil 57, top plate 61, magnet 62, bottom plate 63, and pole piece 66) of the speaker driver 55 in Newton per Ampere (N/A), (2) a second curve 152 representing a suspension stiffness factor $K_m$ of a suspension (e.g., surround roll 58, spider 67, plus air load) of the speaker driver 55 in Newton per millimeter (N/mm), (3) a third curve 153 representing a voice-coil inductance $L_e$ of a driver voice coil 57 of the speaker driver 55 in 100 microhenries (100 μH), and (4) a fourth curve 154 representing a derivative $$\frac{dL_e(x)}{dx}$$

of the voice-coil inductance $L_e$ in 10 microhenries per mm (10 μH/mm). As shown in FIG. 5, changes/variation of the voice-coil inductance $L_e$ can be large, and the derivative $$\frac{dL_e(x)}{dx}$$

assumes both negative and positive values in this example.

Figure 6A:
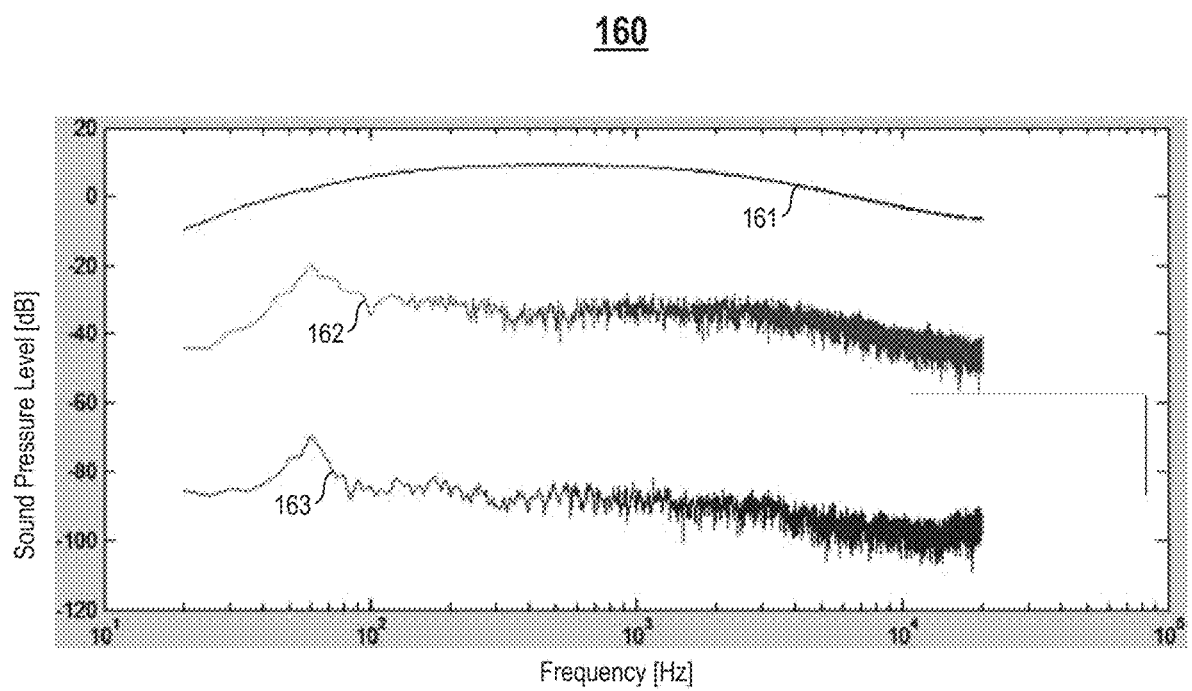
FIG. 6A is an example graph illustrating a simulated performance of a loudspeaker device without any reluctance force compensation.

FIG. 6A is an example graph 160 illustrating a simulated performance of a loudspeaker device 80 without any reluctance force compensation. A horizontal axis of the graph 160 represents frequency in Hertz (Hz). A vertical axis of the graph 160 represents sound pressure level in decibels (dB). The graph 160 comprises each of the following: (1) a first curve 161 representing a frequency response of sound pressure generated by the loudspeaker device, (2) a second curve 162 representing nonlinear variance (i.e., audio distortion) in audio output produced by the loudspeaker device, and (3) a third curve 163 representing noise variance of the audio output produced by the loudspeaker device.

Figure 6B:
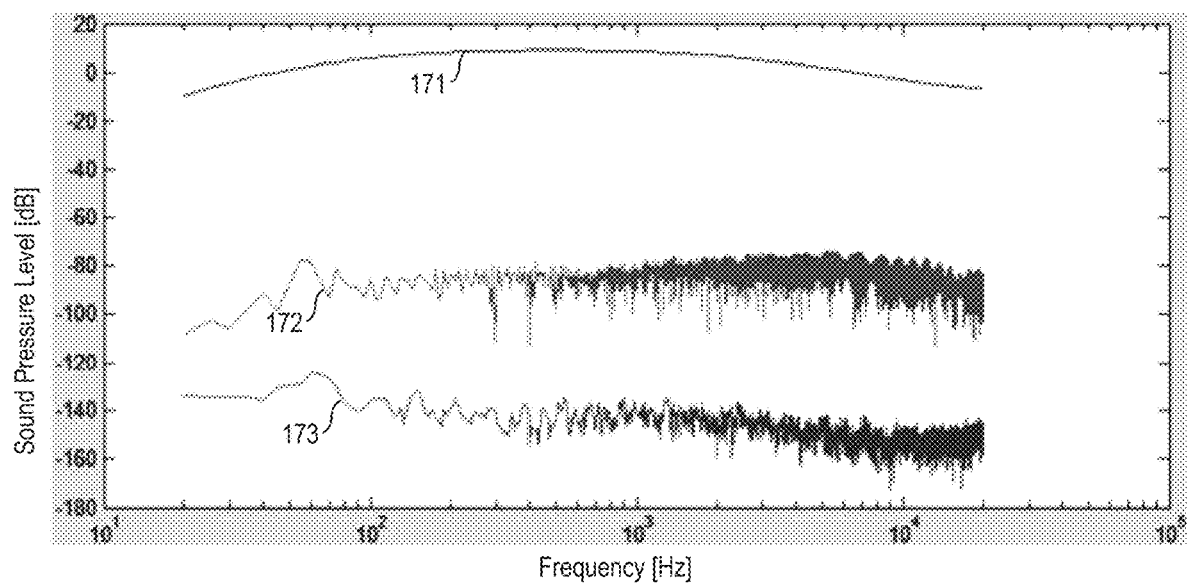
FIG. 6B is an example graph illustrating a simulated performance of the loudspeaker device of the loudspeaker control system in FIG. 3 with reluctance force compensation based on an approximation, in accordance with an embodiment.

FIG. 6B is an example graph 170 illustrating a simulated performance of the loudspeaker device 80 of the loudspeaker control system 100 with reluctance force compensation based on an approximate solution for the factor F, in accordance with an embodiment. A horizontal axis of the graph 170 represents frequency in Hz. A vertical axis of the graph 170 represents sound pressure level in dB. In one embodiment, the controller 110 of the loudspeaker control system 100 is configured to determine an approximation of the factor F based on the fourth-order approximation $F_4$ (determined in accordance with equation (25)). The graph 170 comprises each of the following: (1) a first curve 171 representing a frequency response of sound pressure generated by the loudspeaker device 80, (2) a second curve 172 representing nonlinear variance (i.e., distortion) in audio output produced by the loudspeaker device 80, and (3) a third curve 173 representing noise variance of the audio output produced by the loudspeaker device 80. Compared to FIG. 6A, providing reluctance force compensation improves sound quality of the audio output produced by the loudspeaker device 80, reducing the nonlinear variance (i.e., reducing audio distortion).

Figure 6C:
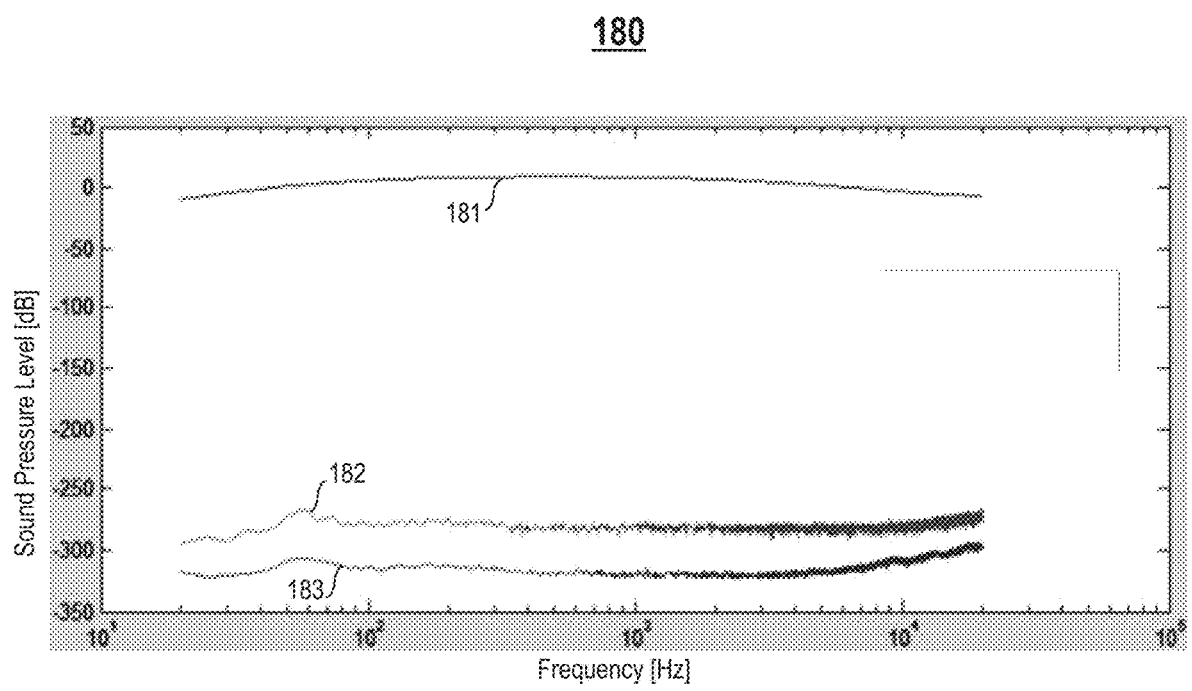
FIG. 6C is an example graph illustrating a simulated performance of the loudspeaker device of the loudspeaker control system in FIG. 3 with reluctance force compensation based on an exact value, in accordance with an embodiment.

FIG. 6C is an example graph 180 illustrating a simulated performance of the loudspeaker device 80 of the loudspeaker control system 100 with reluctance force compensation based on an exact solution for the factor F, in accordance with an embodiment. A horizontal axis of the graph 180 represents frequency in Hz. A vertical axis of the graph 180 represents sound pressure level in dB. In one embodiment, the controller 110 of the loudspeaker control system 100 is configured to determine an exact value of the factor F based on the exact solution for the factor F (represented by equation (14)). The graph 180 comprises each of the following: (1) a first curve 181 representing a frequency response of sound pressure in the loudspeaker device 80, (2) a second curve 182 representing nonlinear variance in audio output produced by the loudspeaker device 80, and (3) a third curve 183 representing noise variance of the audio output produced by the loudspeaker device 80. Compared to FIG. 6A, providing reluctance force compensation improves sound quality of the audio output produced by the loudspeaker device 80, reducing the nonlinear variance to greater than 250 dB below the frequency response of sound pressure in the loudspeaker device 80.

Figure 7:
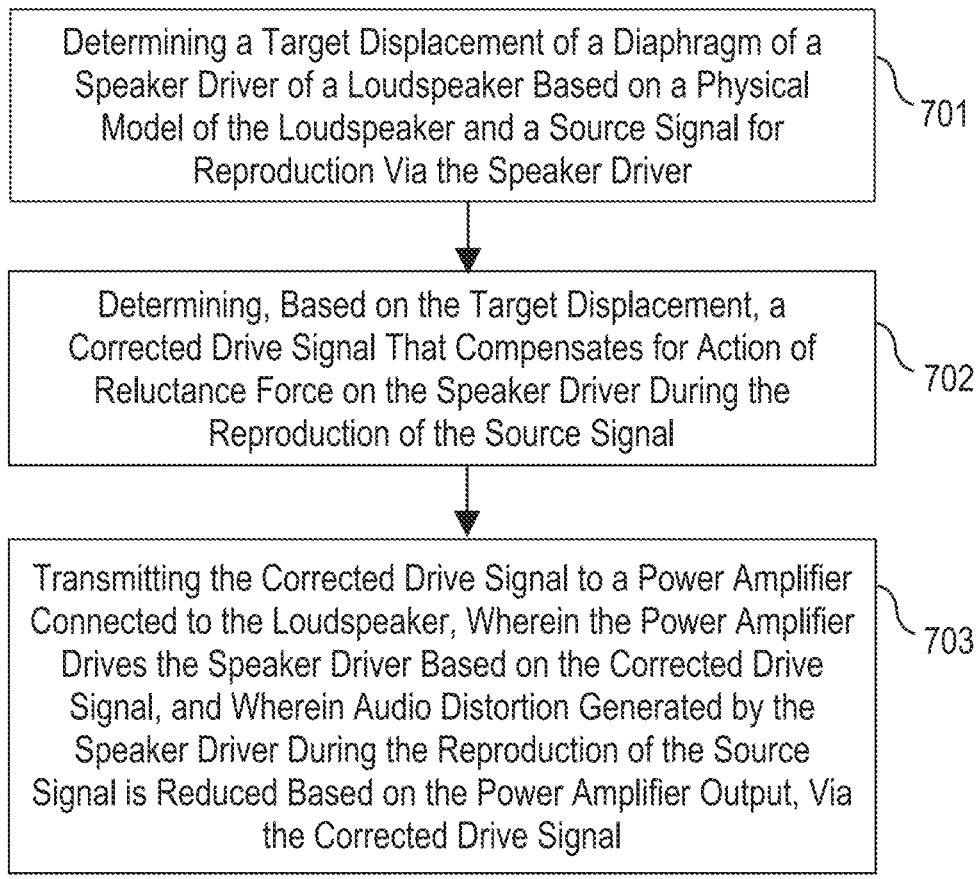
FIG. 7 is an example flowchart of a process for reluctance force compensation for loudspeaker control, in accordance with an embodiment.

FIG. 7 is an example flowchart of a process 700 for reluctance force compensation for loudspeaker control, in accordance with an embodiment. Process block 701 includes determining a target displacement of a diaphragm (e.g., diaphragm 56) of a speaker driver (e.g., speaker driver 65) of a loudspeaker (e.g., loudspeaker device 80) based on a physical model of the loudspeaker and a source signal for reproduction via the speaker driver. Process block 702 includes determining, based on the target displacement, a corrected drive signal that compensates for action of reluctance force on the speaker driver during the reproduction of the source signal. Process block 703 includes transmitting the corrected drive signal to a power amplifier (e.g., power amplifier 75) connected to the loudspeaker, wherein the power amplifier drives the speaker driver based on the corrected drive signal, and wherein audio distortion generated by the speaker driver during the reproduction of the source signal is reduced based on the power amplifier output, via the corrected drive signal.

In one embodiment, one or more components of the loudspeaker control system 100, such as the controller 110, are configured to perform process blocks 701-703.

Figure 8:
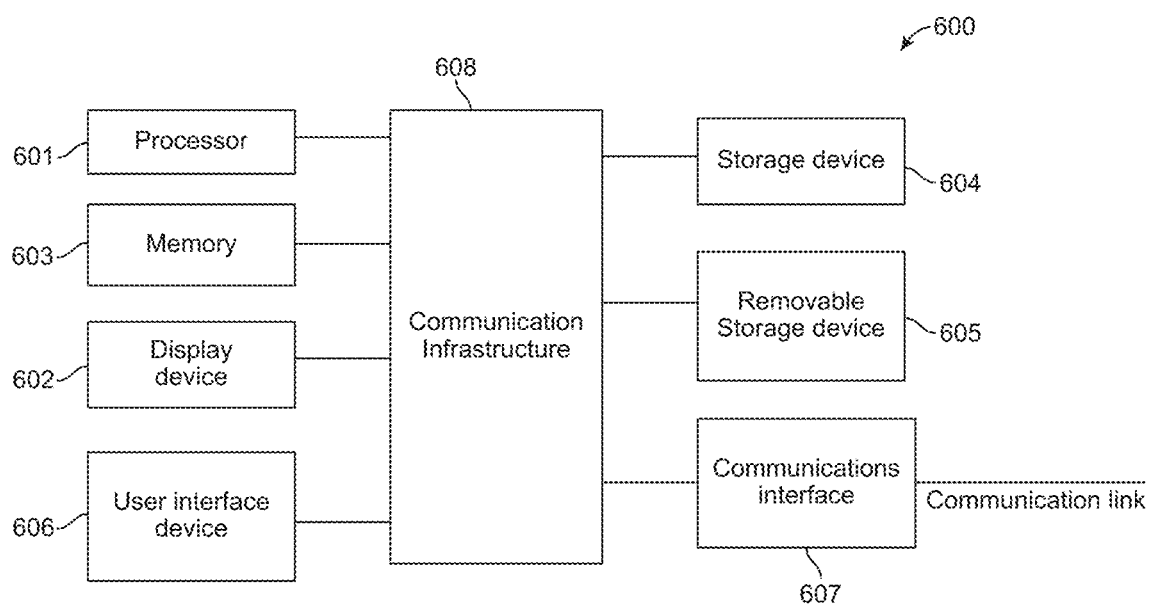
FIG. 8 is a high-level block diagram showing an information processing system comprising a computer system useful for implementing various disclosed embodiments.

FIG. 8 is a high-level block diagram showing an information processing system comprising a computer system 600 useful for implementing various disclosed embodiments. The computer system 600 includes one or more processors 601, and can further include an electronic display device 602 (for displaying video, graphics, text, and other data), a main memory 603 (e.g., random access memory (RAM)), storage device 604 (e.g., hard disk drive), removable storage device 605 (e.g., removable storage drive, removable memory module, a magnetic tape drive, optical disk drive, computer readable medium having stored therein computer software and/or data), user interface device 606 (e.g., keyboard, touch screen, keypad, pointing device), and a communication interface 607 (e.g., modem, a network interface (such as an Ethernet card), a communications port, or a PCMCIA slot and card).

The communication interface 607 allows software and data to be transferred between the computer system 600 and external devices. The nonlinear controller 600 further includes a communications infrastructure 608 (e.g., a communications bus, cross-over bar, or network) to which the aforementioned devices/modules 601 through 607 are connected.

Information transferred via the communications interface 607 may be in the form of signals such as electronic, electromagnetic, optical, or other signals capable of being received by communications interface 607, via a communication link that carries signals and may be implemented using wire or cable, fiber optics, a phone line, a cellular phone link, a radio frequency (RF) link, and/or other communication channels. Computer program instructions representing the block diagrams and/or flowcharts herein may be loaded onto a computer, programmable data processing apparatus, or processing devices to cause a series of operations performed thereon to produce a computer implemented process. In one embodiment, processing instructions for process 700 (FIG. 7) may be stored as program instructions on the memory 603, storage device 604, and/or the removable storage device 605 for execution by the processor 601.

Embodiments have been described with reference to flowchart illustrations and/or block diagrams of methods, apparatus (systems), and computer program products. In some cases, each block of such illustrations/diagrams, or combinations thereof, can be implemented by computer program instructions. The computer program instructions when provided to a processor produce a machine, such that the instructions, which executed via the processor create means for implementing the functions/operations specified in the flowchart and/or block diagram. Each block in the flowchart/block diagrams may represent a hardware and/or software module or logic. In alternative implementations, the functions noted in the blocks may occur out of the order noted in the figures, concurrently, etc.

The terms "computer program medium," "computer usable medium," "computer readable medium," and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Computer program instructions may be stored in a computer readable medium that can direct a computer, other programmable data processing apparatuses, or other devices to function in a particular manner, such that the instructions stored in the computer readable medium produce an article of manufacture including instructions which implement the function/act specified in the flowchart and/or block diagram block(s).

As will be appreciated by one skilled in the art, aspects of the embodiments may be embodied as a system, method or computer program product. Accordingly, aspects of the embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the embodiments may take the form of a computer program product embodied in one or more computer readable medium(s) having computer readable program code embodied thereon.

Any combination of one or more computer readable medium(s) may be utilized. The computer readable medium may be a computer readable storage medium (e.g., a non-transitory computer readable storage medium). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of one or more embodiments may be written in any combination of one or more programming languages, including an object oriented programming language such as Java, Smalltalk, C++, or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In some cases, aspects of one or more embodiments are described above with reference to flowchart illustrations and/or block diagrams of methods, apparatuses (systems), and computer program products. In some instances, it will be understood that each block of the flowchart illustrations and/or block diagrams, and combinations of blocks in the flowchart illustrations and/or block diagrams, can be implemented by computer program instructions. These computer program instructions may be provided to a special purpose computer, or other programmable data processing apparatus to produce a machine, such that the instructions, which execute via the processor of the computer or other programmable data processing apparatus, create means for implementing the functions/acts specified in the flowchart and/or block diagram block(s).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block(s).

The computer program instructions may also be loaded onto a computer, other programmable data processing apparatuses, or other devices to cause a series of operational steps to be performed on the computer, other programmable apparatuses, or other devices to produce a computer implemented process such that the instructions which execute on the computer or other programmable apparatuses provide processes for implementing the functions/acts specified in the flowchart and/or block diagram block(s).

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of pre-AIA 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the invention.

Though the embodiments have been described with reference to certain versions thereof; however, other versions are possible. Therefore, the spirit and scope of the appended claims should not be limited to the description of the preferred versions contained herein.

What is claimed is:

1. A system for nonlinear control of a loudspeaker, the system comprising:
a power amplifier connected to the loudspeaker; and
a controller connected to the power amplifier, wherein the controller is configured to:
determine a target displacement of a diaphragm of a speaker driver of the loudspeaker based on a physical model of the loudspeaker and a source signal for reproduction via the speaker driver;
determine, based on the target displacement, a corrected drive signal that limits effects of reluctance force on the speaker driver during the reproduction of the source signal; and
reproduce the source signal by transmitting the corrected drive signal to the power amplifier, wherein the power amplifier drives the speaker driver based on the corrected drive signal during the reproduction of the source signal.

2. The system of claim 1, wherein the physical model is a nonlinear model.

3. The system of claim 1, wherein the target displacement is further based on a target sound pressure for the loudspeaker to produce during the reproduction of the source signal.

4. The system of claim 1, wherein the power amplifier is configured to drive the speaker driver by amplifying the source signal based on the corrected drive signal, and audio distortion generated by the speaker driver during the reproduction of the source signal is reduced based on output of the power amplifier, via the corrected drive signal.

5. The system of claim 1, wherein the power amplifier is one of: a current amplifier configured to drive the speaker driver with a target current specified by the corrected drive signal, or a voltage amplifier configured to drive the speaker driver with a target voltage specified by the corrected drive signal.

6. The system of claim 1, wherein the controller is further configured to:
determine a target drive signal that produces the target displacement;
determine a correction factor that limits the effects of reluctance force on the speaker driver during the reproduction of the source signal; and
apply the correction factor to the target drive signal, resulting in the corrected drive signal.

7. The system of claim 6, wherein the correction factor is based on an exact value.

8. The system of claim 6, wherein the correction factor is based on an approximation.

9. The system of claim 8, wherein the approximation is a Taylor series approximation.

10. A method for nonlinear control of a loudspeaker, the method comprising:
determining a target displacement of a diaphragm of a speaker driver of the loudspeaker based on a physical model of the loudspeaker and a source signal for reproduction via the speaker driver;
determining, based on the target displacement, a corrected drive signal that limits effects of reluctance force on the speaker driver during the reproduction of the source signal; and
reproducing the source signal by transmitting the corrected drive signal to a power amplifier connected to the loudspeaker, wherein the power amplifier drives the speaker driver based on the corrected drive signal during the reproduction of the source signal.

11. The method of claim 10, wherein the physical model is a nonlinear model.

12. The method of claim 10, wherein the target displacement is further based on a target sound pressure for the loudspeaker to produce during the reproduction of the source signal.

13. The method of claim 10, wherein the power amplifier is configured to drive the speaker driver by amplifying the source signal based on the corrected drive signal, and audio distortion generated by the speaker driver during the reproduction of the source signal is reduced based on output of the power amplifier, via the corrected drive signal.

14. The method of claim 10, further comprising:
determining a target drive signal that produces the target displacement;
determining a correction factor that limits the effects of reluctance force on the speaker driver during the reproduction of the source signal; and
applying the correction factor to the target drive signal, resulting in the corrected drive signal.

15. The method of claim 14, wherein the correction factor is based on one of an exact value or an approximation.

16. The method of claim 15, wherein the approximation is a Taylor series approximation.

17. A loudspeaker device comprising:
a speaker driver including a diaphragm;
a power amplifier connected to the speaker driver; and
a controller connected to the power amplifier, wherein the controller is configured to:
determine a target displacement of the diaphragm based on a physical model of the loudspeaker device and a source signal for reproduction via the speaker driver;
determine, based on the target displacement, a corrected drive signal that limits effects of reluctance force on the speaker driver during the reproduction of the source signal; and
reproduce the source signal by transmitting the corrected drive signal to the power amplifier, wherein the power amplifier drives the speaker driver based on the corrected drive signal during the reproduction of the source signal.

18. The loudspeaker device of claim 17, wherein the physical model is a nonlinear model.

19. The loudspeaker device of claim 17, wherein the controller is further configured to:
determine a target drive signal that produces the target displacement;
determine a correction factor that limits the effects of reluctance force on the speaker driver during the reproduction of the source signal; and
apply the correction factor to the target drive signal, resulting in the corrected drive signal.

20. The loudspeaker device of claim 19, wherein the correction factor is based on one of an exact value or an approximation.

* * * * *